United States Patent
Horne et al.

(10) Patent No.: US 6,412,085 B1
(45) Date of Patent: Jun. 25, 2002

(54) METHOD AND APPARATUS FOR A SPECIAL STRESS MODE FOR N-NARY LOGIC THAT INITIALIZES THE LOGIC INTO A FUNCTIONALLY ILLEGAL STATE

(75) Inventors: Stephen C. Horne; Kenneth D. Amstutz, both of Austin, TX (US)

(73) Assignee: Intrinsity, Inc., Austin, TX (US)

( * ) Notice: Subject to any disclaimer, the term of this patent is extended or adjusted under 35 U.S.C. 154(b) by 0 days.

(21) Appl. No.: 09/468,760

(22) Filed: Dec. 21, 1999

Related U.S. Application Data (60) Provisional application No. 60/148,875, filed on Aug. 13, 1999.

(51) Int. Cl.[7] ............................................. G01R 31/28
(52) U.S. Cl. ..................................... 714/731; 714/726
(58) Field of Search ........................... 365/201; 326/93; 375/213; 714/724, 718, 731, 726; 327/227; 713/500

(56) References Cited

U.S. PATENT DOCUMENTS

| | | | | |
|---|---|---|---|---|
| 5,375,091 A | * | 12/1994 | Berry, Jr. et al. | ............ 365/201 |
| 5,434,520 A | * | 7/1995 | Yetter et al. | .................... 326/93 |
| 5,450,455 A | * | 9/1995 | Hamilton et al. | ............ 375/213 |
| 5,483,543 A | * | 1/1996 | Hosokawa et al. | ......... 714/724 |
| 5,517,136 A | * | 5/1996 | Harris et al. | ................... 326/93 |
| 5,627,787 A | * | 5/1997 | McClure | ..................... 365/201 |
| 5,870,411 A | * | 2/1999 | Durham et al. | ............... 326/93 |
| 5,886,540 A | * | 3/1999 | Perez | ........................... 326/93 |
| 5,951,702 A | * | 9/1999 | Lim et al. | .................... 714/718 |
| 5,952,861 A | * | 9/1999 | Kim et al. | ................... 327/227 |
| 6,185,691 B1 | * | 2/2001 | Gandhi et al. | ............. 713/500 |

* cited by examiner

*Primary Examiner*—David Ton
(74) *Attorney, Agent, or Firm*—Booth & Wright, LLP; Matthew J. Booth (57) ABSTRACT

The present invention is a method and apparatus that initializes N-NARY logic and dynamic logic to a special stress mode. The present invention has a logic circuit that includes a shared logic tree with one or more evaluate nodes, one or more precharge devices, and an evaluate device. Coupled to the evaluate nodes is a state generation control circuit that generates a state signal. A state generation circuit receives the state signal from the state generation control circuit and initializes the evaluate nodes to a functionally illegal state that initializes the logic circuit to the special stress mode. One embodiment of the present invention initializes the evaluate nodes to a low state. When the first logic circuit in a series of logic circuits is initialized to the functionally illegal state, the present invention will initialize the succeeding logic circuits in the series as each phase in the different clock domains evaluate, which initializes the succeeding logic circuits to the special stress mode.

20 Claims, 10 Drawing Sheets

METHOD AND APPARATUS FOR A SPECIAL STRESS MODE FOR N-NARY LOGIC THAT INITIALIZES THE LOGIC INTO A FUNCTIONALLY ILLEGAL STATE

This application claims the benefits of the earlier filed U.S. Provisional App. Ser. No. 60/148,875, filed Aug. 13, 1999 (13.08.99), which is incorporated by reference for all purposes into this specification.

BACKGROUND OF THE INVENTION

1. Field of the Invention

The present invention relates to the field of testing dynamic logic and related logic families such as N-NARY logic. More specifically, the present invention relates to stress testing dynamic logic and N-NARY logic.

2. Description of the Related Art

It is well known that the failure rate in a manufactured semiconductor device population is relatively high at the beginning of the operating life of the devices and decreases to a stable, lower failure rate for the remainder of the lifetime, increasing again at the end of the devices lifetime due to wear out mechanisms. Devices that fail early in their expected lifetime are said to experience infant mortality with these types of failures being called early life failures. Early life failures can be caused by latent defects, which are defects in the semiconductor device that are not detectable by normal initial testing. Early life failures cause problems for the manufacturers and consumers of semiconductors because by the time the early failures are detected, additional manufacturing cost has been invested in the final consumer product.

In order to reduce the infant mortality rate, the semiconductor device manufacturer attempts to accelerate the infant mortality failure mechanisms by a variety of different methods. Two of the most common methods for accelerating these latent defects are burn-in and stress testing. Burn-in generally involves operating each device in the device population at some specific temperature (usually a high temperature) for a certain amount of time (typically in the range of a few hours to a few days). Generally, burn-in is performed at a higher-than-usual voltage because it has been found that higher voltage accelerates defects. Following burn-in, the device population is tested to screen out the failed devices (if any). Stress testing, on the other hand, involves operating the device at a high voltage for a very short time and immediately testing the device afterwards for failure. Stress testing may be dynamic, in which clocks and signals switch under high voltage, or static, in which signals are held in a static state while high voltage is applied. For CMOS devices, static stress testing may also be accompanied by a current measurement test. This is because device current is very low when the device is in a quiescent state; current flow under high voltage is indicative of a defective or unreliable device. Either stress testing, burn-in, or both may be used to reduce early life failures of devices before or after the devices are shipped to consumers.

In order to reduce manufacturing costs and ensure quality outgoing products, it is important for burn-in and/or stress testing to accelerate failures in the most efficient and predictable way possible. It is therefore important that as many internal devices of the semiconductor device as possible be stressed during such testing. The extent that the device is exercised or stressed can be measured by the semiconductor device's internal node toggle rates and coverage. Unfortunately, guaranteeing high node toggle rates and coverage is often compromised by several factors. First, device operation is often unreliable at extended temperature and/or voltage. Second, burn-in, and test hardware is more costly if it is required to exercise the devices with complex or lengthy test patterns.

The problem of reliably and efficiently exercising semiconductor devices under extended voltage and temperature conditions is made even more difficult when the device uses dynamic CMOS logic or related logic families. This is true because dynamic CMOS logic has reduced operational noise margins as compared to conventional static or complementary CMOS logic. These noise margins are further reduced at high voltage and high temperature because noise levels increase with higher voltage and sensitivity to noise increases at high temperature and high voltage. Additionally, high temperature reduces n-channel MOS threshold voltages, which make n-channel evaluate trees more sensitive to input-low noise. An advantage of using dynamic CMOS logic over complementary CMOS logic is that higher operating speeds are generally possible with dynamic logic. The noise margin problem of dynamic logic at extended voltage and/or temperature can be improved through various circuit design techniques, but these techniques usually involve some cost in terms of area, power, or operating frequency.

One of the most common noise problems in dynamic logic is the undesired discharge of a dynamic node. For n-channel evaluate trees this can be caused by noise on input signals to a gate that is supposed to be in the low state. Differential ground noise or noise coupled onto these input signals may cause the already slim ground noise margin to deteriorate further and eventually may cause device malfunction. Therefore, it can be seen that while dynamic CMOS logic offers speed advantages over conventional static or complementary CMOS logic, dynamic logic poses problems when required to operate at extended temperature or voltage conditions as required during burn-in or stress testing.

The present invention overcomes the above problems and provides dynamic logic and related logic families with the ability to operate at higher temperatures and voltages than previously possible. The present invention also provides greater coverage of exercised defects with minimal test patterns. This new operational mode increases the effectiveness of burn-in and stress testing for dynamic logic. EVSX, Inc. has invented a new logic family called N-NARY logic, which can be characterized as a fully-dynamic and self-synchronized logic family. N-NARY logic is more fully described in a patent application, U.S. Pat. Application Ser. No. 09/019355, filed Feb. 05, 1998 (05.02.1998), now U.S. Pat. No. 6,066,965, and titled "Method and Apparatus for a N-Nary logic Circuit Using 1- of -4 Encoding", which is incorporated by reference for all purposes and is referred to as "The N-nary Patent." It is noted that signals in this logic family are one- or zero-hot collections of 2 or more wires that are precharged and evaluate every cycle.

Additionally, the present invention is related to the logic synchronization techniques fully described in a patent application, U.S. Pat. Application Ser. No. 09/179330, filed Oct. 27, 1998 (27.10.1998), now U.S. Pat. No. 6,118,304, and titled "Method and Apparatus for Logic Synchronization", which is incorporated by reference for all purposes.

Additionally, the present invention is related to the scannable logic techniques fully described in a patent application, U.S. Pat. App. Ser. No. 09/468,992, filed Dec.

21, 1999 (21.12.1999), now U.S. Pat. No. 6,271,683, and titled "Dynamic Logic Scan Gate Method and Apparatus", which is incorporated by reference for all purposes and is referred to as the "Scan Patent".

SUMMARY

The present invention comprises a method and apparatus for N-NARY logic and dynamic logic that initializes the logic to a special stress mode. The present invention comprises a logic circuit that includes a shared logic tree with one or more evaluate nodes, one or more precharge devices, and an evaluate device. Coupled to the evaluate nodes is a state generation control circuit that generates a state signal. A state generation circuit receives the state signal from the state generation control circuit and initializes the evaluate nodes to a functionally illegal state that initializes the logic circuit to a special stress mode. One embodiment of the present invention initializes the evaluate nodes to a low state. Additionally, the state generation circuit can further comprise additional functions such as scan and reset. And, the present invention can comprise N-NARY logic and or dynamic logic. When the first logic circuit in a series of logic circuits is initialized to the functionally illegal state, the present invention will initialize the succeeding logic circuits in the series as each phase in the different clock domains evaluate, which initializes the succeeding logic circuits to the special stress mode.

BRIEF DESCRIPTION OF THE DRAWINGS

To further aid in understanding the invention, the attached drawings help illustrate specific features of the invention and the following is a brief description of the attached drawings:

FIGS. 7A–C illustrate several aspects of the embodiment of FIG. 6.

DETAILED DESCRIPTION OF THE INVENTION

The present invention comprises a method and apparatus for a special stress mode for N-NARY logic that initializes the logic into a functionally illegal state. This disclosure describes numerous specific details that include specific structures, circuits, and logic functions in order to provide a thorough understanding of the present invention. One skilled in the art will appreciate that one may practice the present invention without these specific details.

The present invention involves putting the N-NARY logic into a functionally illegal state called the "high-activity" state. The high activity state is characterized by signals that are normally zero- or one-hot to be in an all-ones state (in other words, all of the wires of the bundle of wires that comprise the 1 of N signal are active). It will be seen later in this disclosure that once the high activity state is entered, it is self-perpetuating in the sense that the high activity state will flow through a series of logic circuits as time progresses.

From the circuit perspective, if all inputs to an N-NARY gate go high, then all internal dynamic nodes must be discharged (go low) and therefore all of the gate outputs must go high. This state is illegal in N-NARY logic in that the desired function of the logic circuit or device is lost while in this operating mode. However, this functionally illegal state or high activity mode has the valuable property that all inter-gate and intra-gate wires are precharged and discharged every clock cycle. Therefore, this mode is invaluable during burn-in because the toggle (or switch) coverage is 100% (i.e., all internal nodes within the logic circuit are toggling or switching) and the toggle rate is also 100% (i.e., each internal node is toggling every clock cycle). Furthermore, one skilled in the art will appreciate that all of the transistor gate oxides in the individual gates will receive a full stress voltage during one half of the cycle or the other half of the cycle, which exposes gate oxide defects to detection by current measurement and/or accelerating latent gate oxide defects. In this way, latent defects in N-NARY logic is accelerated more quickly than if toggle coverage or toggle rates were smaller.

In addition to increasing toggle coverage and toggle rates, the present invention provides conventional dynamic logic or N-NARY logic the ability to operate at higher temperatures and voltages than is normally possible. The increased operational range is due to the operational characteristic that there can be no inadvertent discharge of an internal dynamic node when discharge of every internal dynamic node every cycle is actually the desired goal. In this way, the desired burn-in and stress test operations occur with much greater noise immunity than would otherwise be possible. The present invention therefore allows both voltage and temperature to be raised to levels that maximize the effectiveness of both stress testing and burn-in testing.

N-NARY logic is a novel logic family that uses a novel signal, a 1 of N signal, to convey information. An N-NARY logic circuit comprises a shared logic tree circuit that evaluates one or more input signals and produces an output signal. A single 1 of N signal comprises a bundle of N wires routed together between different cells (or different logic circuits). A 1 of N signal uses a 1 of N encoding to indicate multiple values of information conveyed by the bundle of wires of the 1 of N signal where at most one and only one wire of the bundle of wires of the 1 of N signal is true during an evaluation phase. Additionally, the 1 of N encoding provides a not valid value (a null value) where zero wires of the bundle of wires of the 1 of N signal is true during an evaluation cycle.

Figure 1:
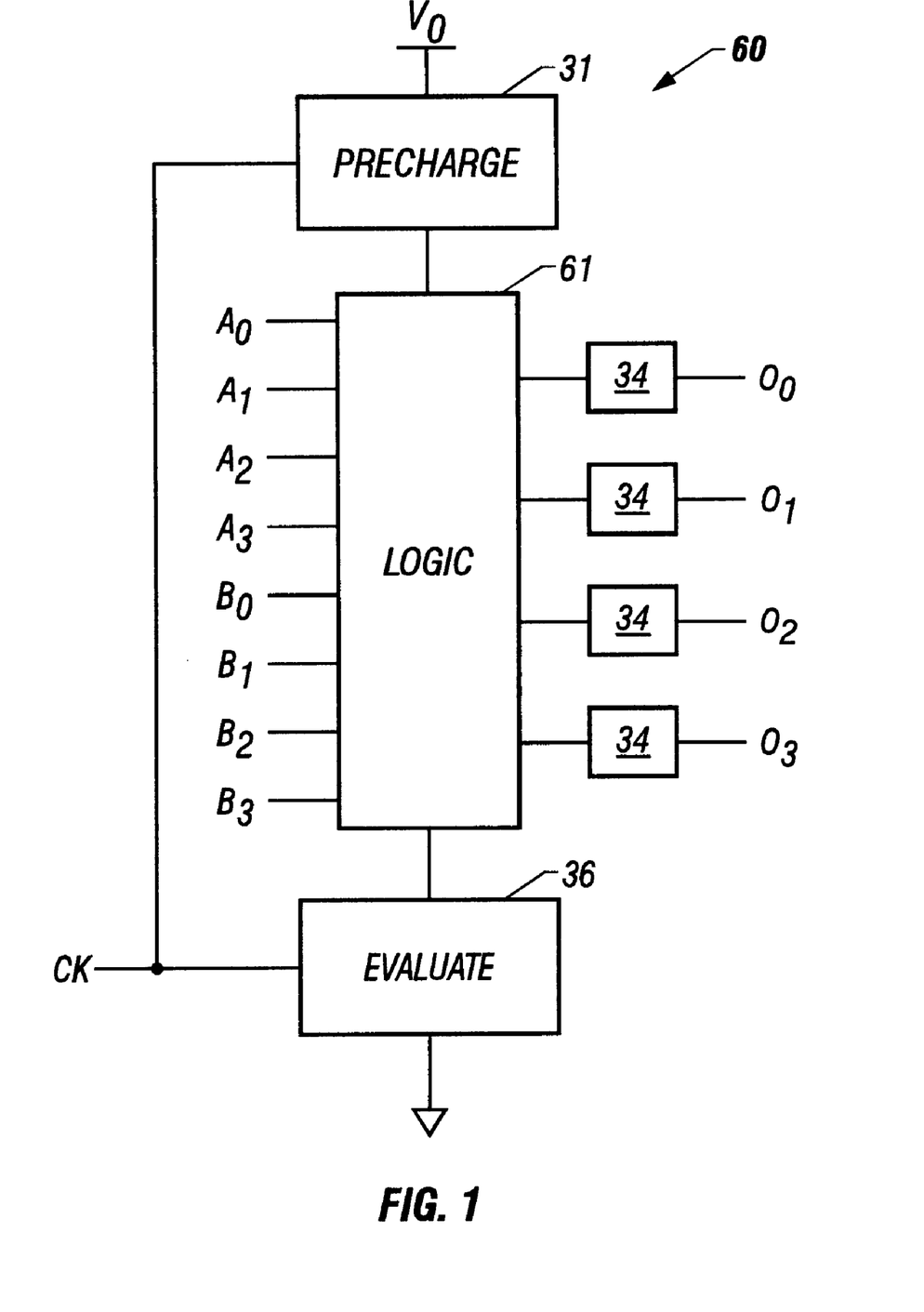
FIG. 1 is a block diagram of an N-NARY logic circuit.

FIG. 1 is a block diagram of an N-NARY logic circuit that illustrates a circuit of N-NARY logic using two sets of 1 of 4 signals for the input signals and a 1 of 4 signal for the output signal. This circuit describes a 2 bit logic gate (a dit) where A is a 2 bit input, B is a 2 bit input, and O is a 2 bit output. In other words, a dit device produces 2 output bits. A device 60 comprises a logic tree circuit 61, a precharge circuit 31, and an evaluate circuit 36. Coupled to the logic tree circuit is the 2 bit input signal A, which is a 1 of 4 signal that comprises a plurality of input values $A_0$, $A_1$, $A_2$, and $A_3$ and their associated wires or logic paths using a 1 of 4 encoding. Additionally coupled to the logic tree circuit is the 2 bit input B, which is another 1 of 4 signal that comprises a plurality of input values $B_0$, $B_1$, $B_2$, and $B_3$ and their associated wires or logic paths using a 1 of 4 encoding. Coupled to the logic tree circuit is the 2 bit output O, which is a 1 of 4 signal that comprises a plurality of output values $O_0$, $O_1$, $O_2$, and $O_3$ and their associated wires or logic paths using a 1 of 4 encoding. The logic tree circuit 61 performs a logic function on a plurality of input signals that could comprise a variety of functions, for example, the Boolean logic functions AND/NAND, OR/NOR, or XOR/Equivalence.

Coupled to the wires of the plurality of output signals are the output buffers 34 that aid in driving additional circuits that couple to the output signals. One embodiment of N-Nary logic uses an output buffer with an inverting function as the output buffer 34.

A precharge circuit 31 couples to the logic tree circuit 61 and precharges the dynamic logic of the logic tree circuit. Each evaluation path of the logic tree circuit has its own precharge P-FET. And, coupled to the precharge circuit 31 is the clock signal CK where a low clock signal on CK will cause the P-FETs to charge.

An evaluate circuit 36 couples to the logic tree circuit and controls the evaluation of the logic tree circuit. And, coupled to the evaluate circuit 36 is the clock signal CK where a high clock signal on CK will cause the N-FET in the evaluate circuit to evaluate.

Figure 3:
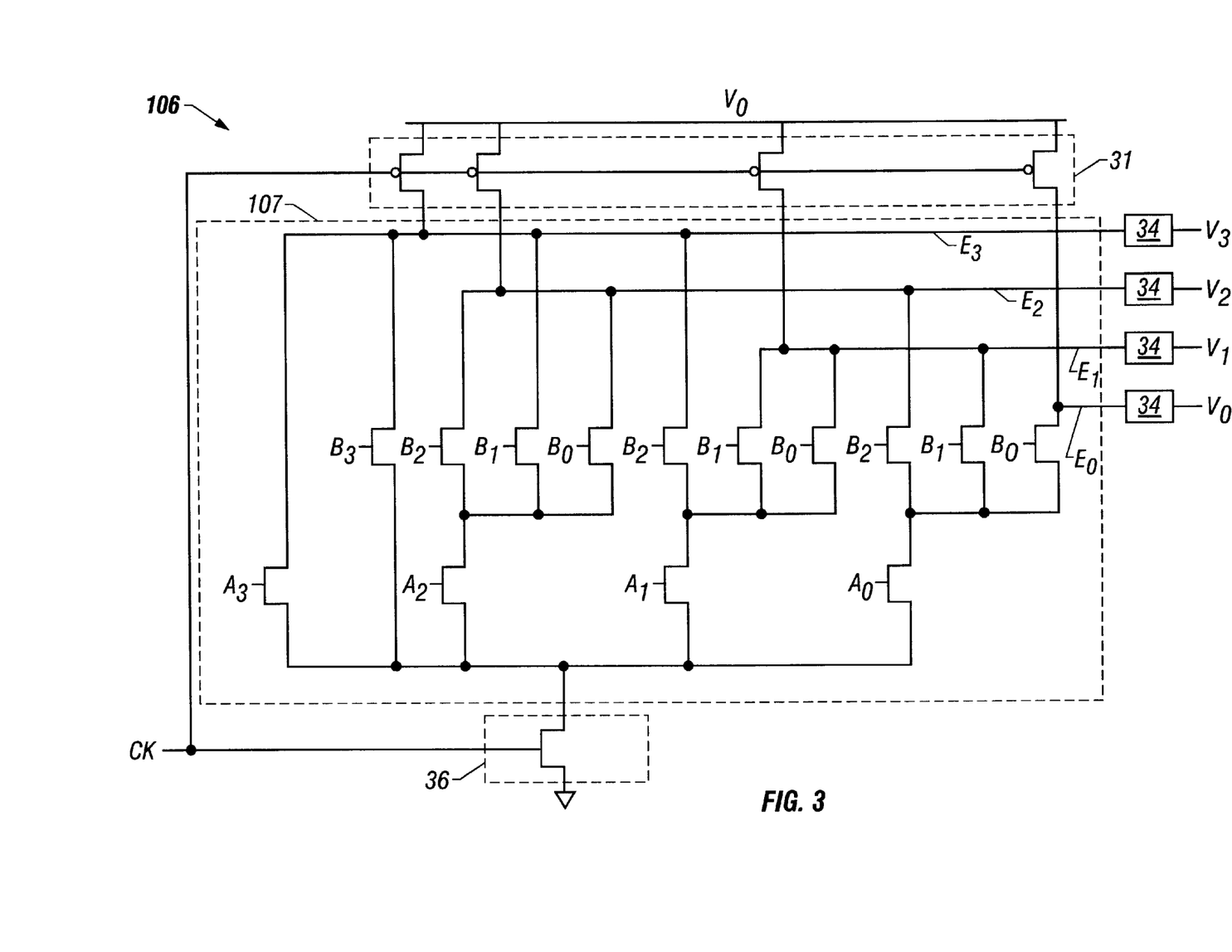
FIG. 3 is a schematic diagram of an N-NARY logic circuit.
Figure 6:
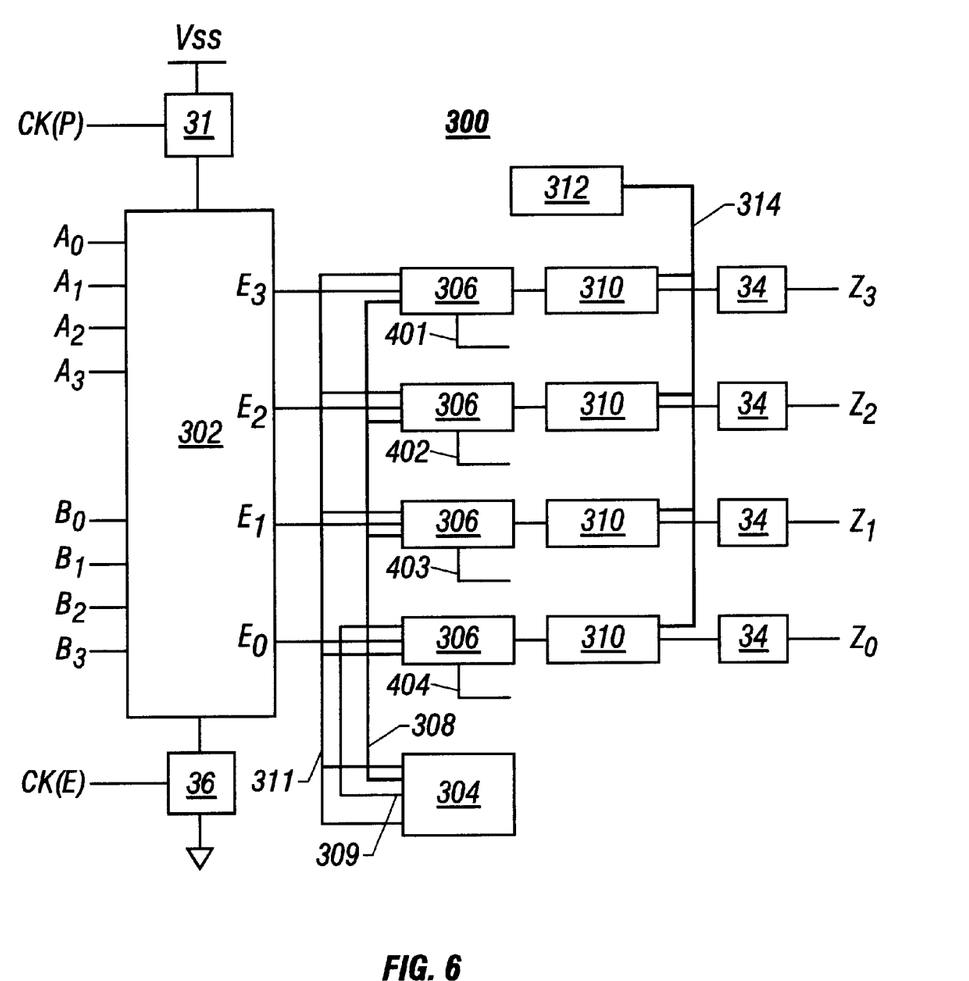
FIG. 6 is an embodiment of the present invention.

If the logic function of logic tree circuit 61 performed an OR/NOR function as found in the circuit of FIG. 3, then the resulting truth table would be Table 1. The mapping of the 1 of 4 encoding for the output comprises a variety of truth tables other than the example above and is dependent on the circuit design. However, Table 1 illustrates that not more than one logic path of the 1 of N encoding has an active high value (or an active logic state) on it during a single evaluation cycle when the data signals are available. In FIG. 6, there are 2 sets of 1 of 4 signals for the input signals and a 1 of 4 signal for the output signal.

Figure 2A:
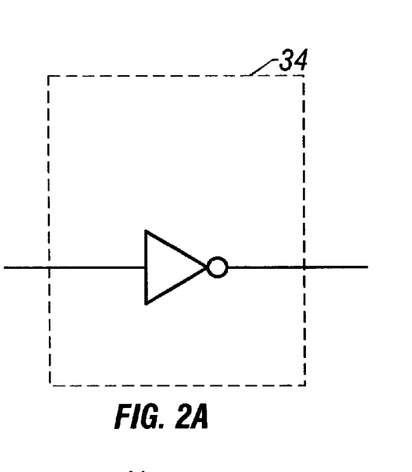
FIGS. 2A–2D illustrate buffer circuits used in N-NARY logic.
Figure 2B:
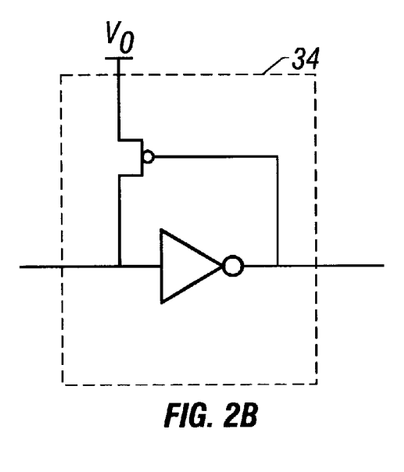

As shown in FIG. 1, output buffers 34 couple to the wires of the plurality of output signals. FIGS. 2A, 2B, 2C, and 2D provide four embodiments of buffer device 34 used in N-Nary logic. FIG. 2A shows a CMOS inverter that inverts the signal on an output logic path. FIG. 2B shows an embodiment of output buffer 34 that is preferred for most N-Nary gates that includes the CMOS inverter that inverts the signal and a feed back keeper transistor that maintains the level of the dynamic node before the signal evaluates. The PFET keeper transistor gives the logic gate a static capability. Additionally, this type of output buffer compensates for parasitic leakages and allows for low speed functionality. The FIG. 2B output buffer 34 is called a half-keeper output buffer.

Figure 2C:
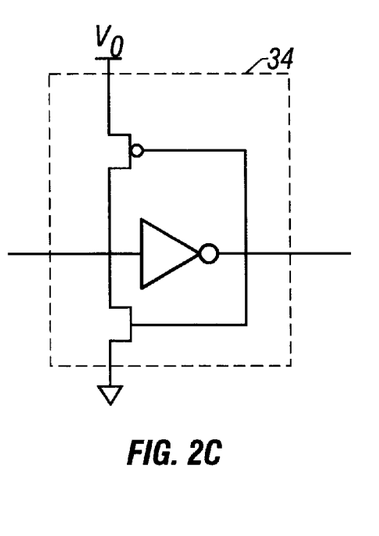
Figure 2D:
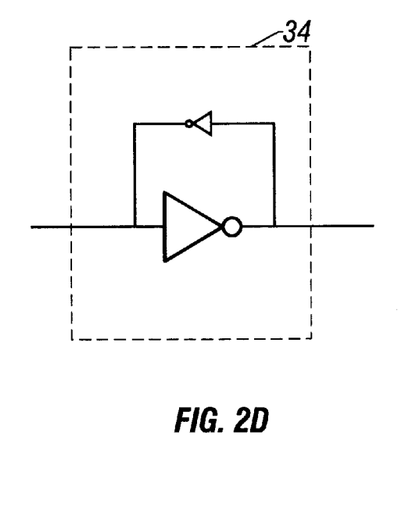

FIG. 2C shows a third embodiment of output buffer 34 that is known as a "full keeper buffer". As shown in FIG. 2C, a full keeper buffer includes the inverter, the PFET keeper feedback transistor, and an additional NFET feedback transistor tied to ground. Those skilled in the art will recognize that FIG. 2D is simply another schematic representation of the FIG. 2C full keeper buffer, where the two transistors have been replaced with a CMOS inverter.

FIG. 3 is a schematic diagram of an N-NARY logic circuit for the OR/NOR function using N-NARY logic and a 1 of 4 encoding. One skilled in the art will appreciate that one function is the inverse of the other function. A device 90 is a dit (a 2 bit) device that has two 2 bit inputs and a 2 bit output that comprises a precharge circuit 31, an evaluate circuit 36, and a logic tree circuit 92. One of the 2 bit input signals comprises a 1 of 4 signal with a plurality of input values $A_0$, $A_1$, $A_2$, and $A_3$ and their associated wires that couple to the logic tree circuit 92 using a 1 of 4 encoding. The other 2 bit input comprises a 1 of 4 signal with a plurality of input values $B_0$, $B_1$, $B_2$, and $B_3$ and their associated wires that couple to the logic tree circuit 92 using a 1 of 4 encoding. A 1 of 4 signal with a plurality of output values $V_0$, $V_1$, $V_2$, and $V_3$ and their associated wires for the 2 bit output couple to the logic tree circuit 92 using the 1 of 4 encoding. Each output signal may comprise an inverting output buffer 34 on the associated wires of the signal. To reduce adding additional capacitance to the device, N-Nary logic uses a single, shared logic tree with multiple evaluation paths for evaluating the function of the logic circuit and for generating the plurality output signals coupled to the logic circuit. The multiple evaluation paths further comprise the internal evaluate nodes $E_0$, $E_1$, $E_2$, and $E_3$.

The precharge circuit 31 has a plurality of P-FETs to quickly and fully precharge all of the dynamic logic in the logic tree circuit during the precharge phase of the clock cycle with each evaluation path of the logic tree circuit having its own precharge P-FET. Coupled to the precharge circuit 31 is a clock signal CK. When the clock signal is low, the precharge tree circuit 31 precharges the N-FETs in the logic tree circuit 92.

The evaluate circuit 36 has a single evaluation transistor, which aids in the speed of the clocking of the device and helps avoid races between other devices. Other circuits may use multiple evaluation devices. Coupled to the evaluate circuit 36 is the clock signal CK. When the clock signal is high, the evaluate circuit 36 evaluates the logic tree circuit 92.

The maximum stack height of this circuit is 2 transistors. For example, the transistors $B_2$ and $A_2$ reside on one evaluation path. The transistor $A_3$ on an evaluation path is an example of a stack height of 1.

The logic tree circuit 92 of this circuit performs the OR/NOR logic function with the following output table for the OR function:

TABLE 1

| $A_3$ | $A_2$ | $A_1$ | $A_0$ | $B_3$ | $B_2$ | $B_1$ | $B_0$ | $V_3$ | $V_2$ | $V_2$ | $V_1$ |
|---|---|---|---|---|---|---|---|---|---|---|---|
| 0 | 0 | 0 | 0 | 0 | 0 | 0 | 0 | 0 | 0 | 0 | 0 |
| 0 | 0 | 0 | 1 | 0 | 0 | 0 | 1 | 0 | 0 | 0 | 1 |
| 0 | 0 | 0 | 1 | 0 | 0 | 1 | 0 | 0 | 0 | 1 | 0 |
| 0 | 0 | 0 | 1 | 0 | 1 | 0 | 0 | 0 | 1 | 0 | 0 |
| 0 | 0 | 0 | 1 | 1 | 0 | 0 | 0 | 1 | 0 | 0 | 0 |
| 0 | 0 | 1 | 0 | 0 | 0 | 0 | 1 | 0 | 0 | 1 | 0 |
| 0 | 0 | 1 | 0 | 0 | 0 | 1 | 0 | 0 | 0 | 1 | 0 |
| 0 | 0 | 1 | 0 | 0 | 1 | 0 | 0 | 1 | 0 | 0 | 0 |
| 0 | 0 | 1 | 0 | 1 | 0 | 0 | 0 | 1 | 0 | 0 | 0 |
| 0 | 1 | 0 | 0 | 0 | 0 | 0 | 1 | 0 | 1 | 0 | 0 |
| 0 | 1 | 0 | 0 | 0 | 0 | 1 | 0 | 1 | 0 | 0 | 0 |
| 0 | 1 | 0 | 0 | 0 | 1 | 0 | 0 | 0 | 1 | 0 | 0 |
| 0 | 1 | 0 | 0 | 1 | 0 | 0 | 0 | 1 | 0 | 0 | 0 |
| 1 | 0 | 0 | 0 | 0 | 0 | 0 | 1 | 1 | 0 | 0 | 0 |
| 1 | 0 | 0 | 0 | 0 | 0 | 1 | 0 | 1 | 0 | 0 | 0 |
| 1 | 0 | 0 | 0 | 0 | 1 | 0 | 0 | 1 | 0 | 0 | 0 |
| 1 | 0 | 0 | 0 | 1 | 0 | 0 | 0 | 1 | 0 | 0 | 0 |

Figure 4:
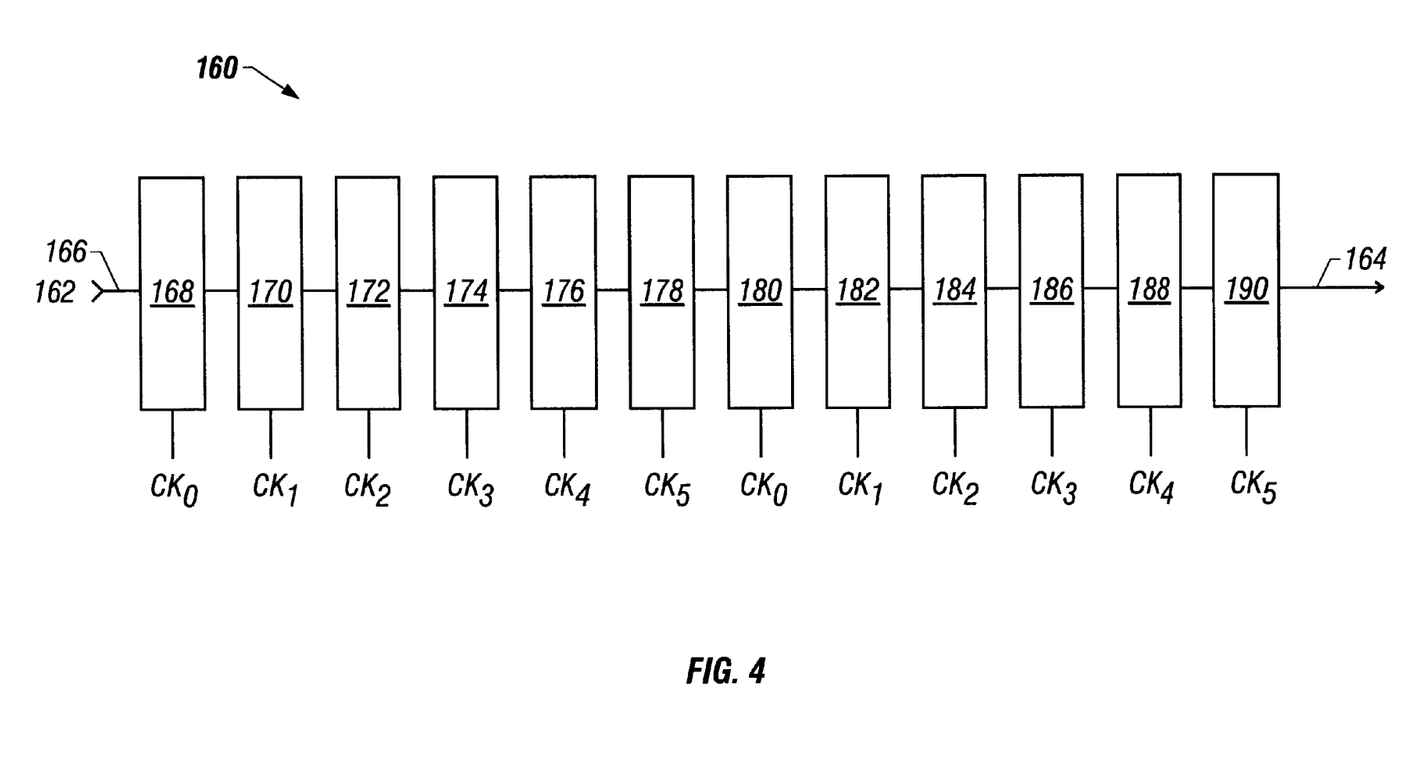
FIG. 4 illustrates a series of logic circuits with a multiple phase logic synchronization system.

FIG. 4 illustrates a series of logic circuits with a multiple phase logic synchronization scheme that uses a six phase clocking system with the clocks CLK0, CLK1, CLK2, CLK3, CLK4, and CLK5. The pipeline 160 comprises a datapath 166, an input signal 162, and an output signal 164. The datapath 166 comprises one or more wires to propagate the signals through the pipeline. For example, the datapath 166 may comprise one or more N-nary signals. Additionally, the input signal 162 and the output signal 264 may comprise signals using N-nary encoding. The series of logic circuits 160 comprises the logic circuits 168, 170, 172, 174, 176, 178, 180, 182, 184, 186, 188, and 190 coupled in series to the datapath 166. The logic circuits may comprise N-nary logic circuits. Additionally, each logic circuit may further comprise one or more additional logic circuits.

Figure 5:
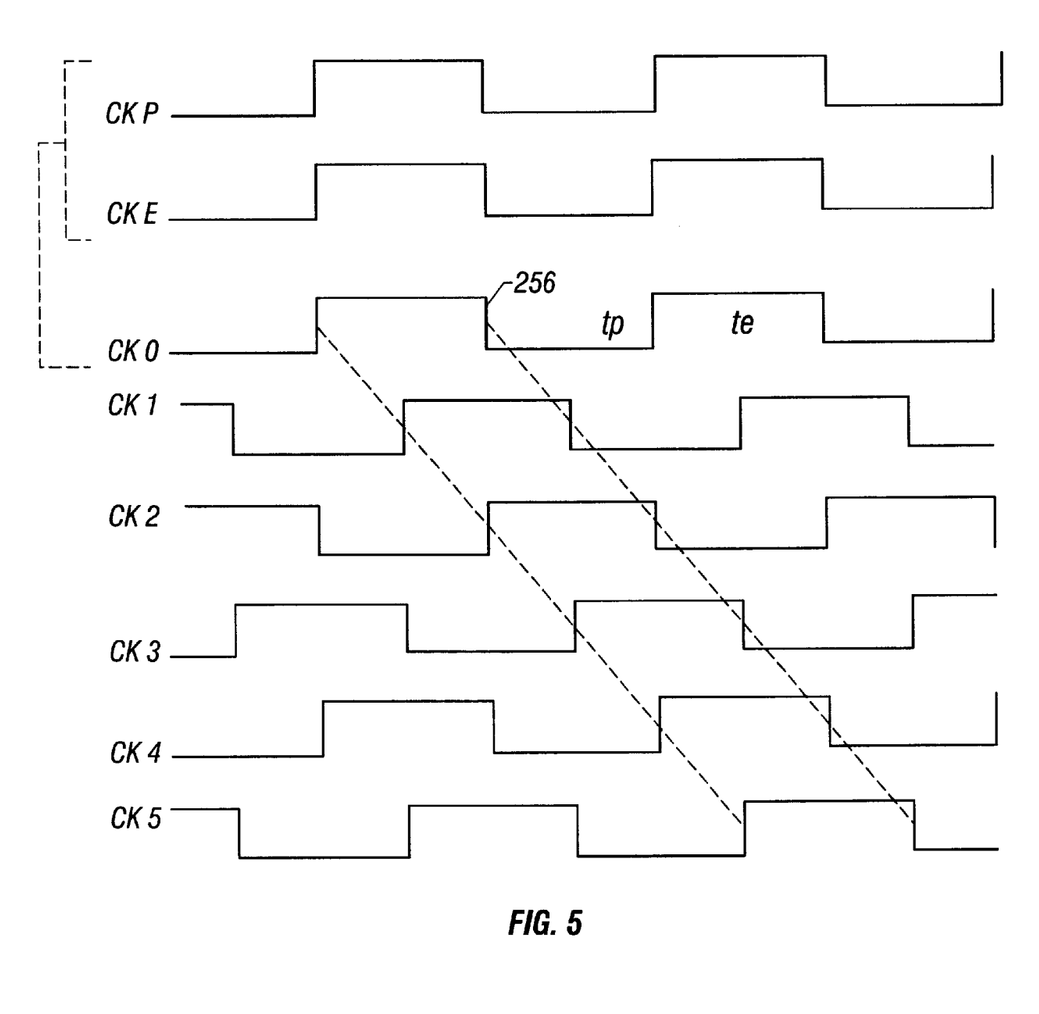
FIG. 5 illustrates the multiple overlapping clock phases used in the present invention.

FIG. 5 illustrates the multiple overlapping clock phases used in the present invention. In FIG. 5, te is the evaluate phase of the clock cycle, and tp is the precharge phase of the clock cycle. Additionally, each individual clock has a 50% duty cycle. The phases of the different clocks are such that the phase of an individual clock signal overlaps the phase of an earlier clock signal by an amount equal to the overlap of the phase of the next clock signal. FIG. 5 illustrates a six phase clocking system with clocks CK0, CK1, CK2, CK3, CK4, and CK5. Reference 256 illustrates the propagation of the "wave" of the evaluate cycles of the different clocks.

FIG. 5 also illustrates two additional clock signals, CK(E) and CK(P). In N-NARY logic, additional functions such as scan and reset require greater control of an individual clock signal. Therefore, one embodiment of the present invention allows for separate control of the timing of the precharge clock, CK(P), from the timing of the evaluate clock, CK(E). By convention, the phase 0 clock, CK0, actually comprises the two separate clocks CK(E) and CK(P), thus allowing greater control of the clock signals for functions that are not within the scope of the present invention. One skilled in the art will appreciate that it is possible to use other conventions in logic synchronization by using other phase clocks signals such as the phase 1 (CK1) clock signal as using the separate evaluate and precharge clocks. The Scan Patent provides greater detail on the use of the separate clock signals CK(P) and CK(E) with the use of the scan function.

FIG. 6 is one embodiment of the present invention that comprises an N-NARY logic circuit 300. The functionally illegal or high activity state is entered by initializing all phase 0 gates to the normally illegal state of all-ones (internal dynamic evaluate nodes are all made zero) through circuitry that sets the illegal state as in logic circuit 300 or through other circuitry for other functions such as random access scan logic or reset. Note that little or no extra hardware is needed to enter the high activity state over the hardware needed to perform a normal functional reset of the device. For example, the typical reset sequence to initialize the device either in a normal functional reset state or in a high activity state is very simple and occurs typically over only a few clock cycles. Once the high activity state is entered, then this state flows to the next logic circuit in the sequence or as described in this disclosure to a phase 1 logic circuit. To come out of the high activity state, a reset signal is required to return the logic to a normal operating mode where the normal operating mode (or reset condition) flows through the clock domains as above over a period of clock cycles.

Referring back to FIG. 6, N-NARY logic circuit 300 comprises a shared logic tree 302 that performs a logic function on the two N-NARY input signals A and B to generate an output N-NARY signal Z. The N-NARY input signal A comprises the input values $A_0$, $A_1$, $A_2$, and $A_3$ and their associated wires; the N-NARY input signal B comprises the input values $B_0$, $B_1$, $B_2$, and $B_3$ and their associated wires; and the N-NARY output signal Z comprises the output values $V_0$, $V_1$, $V_2$, and $V_3$ and their associated wires. The logic circuit 300 additionally comprises the precharge devices 31 that receives the precharge clock CK(P) (one component of the phase 0 clock). And, the logic circuit 300 comprises the evaluate device 36 that receives the evaluate clock CK(E) (another component of the phase 0 clock). And, coupled to the wires of the output signal Z are the output buffers 34.

Figure 7A:
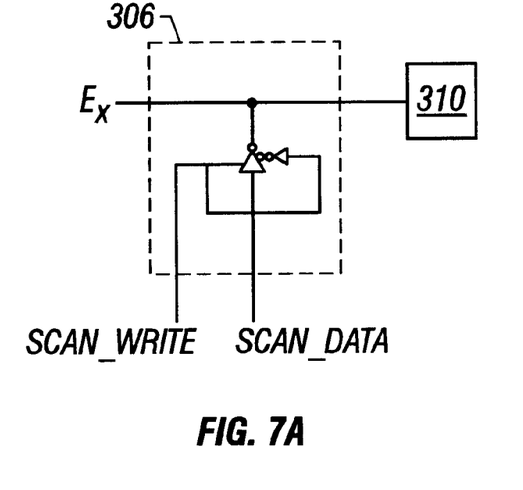
FIG. 7A illustrates a scan generation circuit.
Figure 7B:
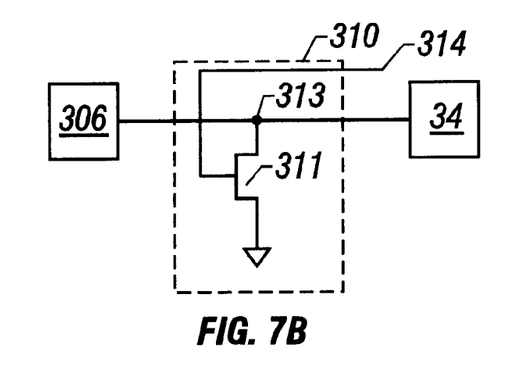
FIG. 7B illustrates a state generation circuit. And, FIG. 7C illustrates an output buffer circuit.
Figure 7C:
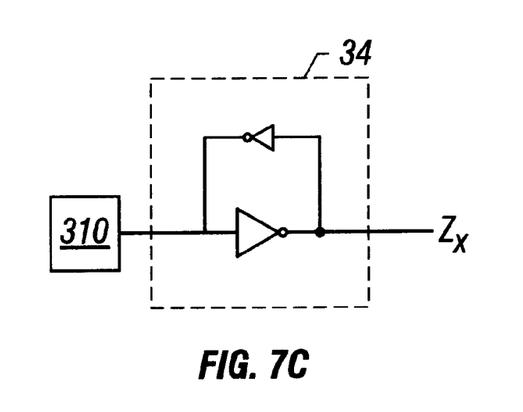

FIG. 7C illustrates that this embodiment of the present invention uses the full keeper output buffers (as illustrated in FIG. 2C) for logic circuits with phase 0 clocks.

This implementation of the present invention can use circuitry specifically to generate and enter the high activity state or the present invention can be combined with circuitry for other functions or uses such as scan or reset. Referring to FIG. 6, coupled to the wires of the output signal Z are the scan generation circuits 306 and the special stress mode or functionally illegal high activity state generation circuits 310. FIG. 6 illustrates an embodiment of the present invention where scan and high activity generation circuits are separate circuits. FIG. 8B, on the other hand illustrates an embodiment of the present invention where the scan and the special stress mode or functionally illegal or high activity state generation circuits are combined into a single circuit 360.

Referring back to FIG. 6, a scan generation control circuit 304 generates the scan control signals on paths 308, 309, and 311, which couple to the scan generation circuits 306. The Scan Patent provides greater detail about one implementation of scan used with N-NARY logic. Briefly, scan write operations (which are also used for reset purposes as well) require that the clocks be stopped so that CK(P) is high (disabling the precharge circuit 31), and that CK(E) is low (disabling the functional discharge paths through circuits 36 and 302). Scan generation control circuit 304 causes scan circuits to generate different values on outputs $Z_0$, $Z_1$, $Z_2$, and $Z_3$. FIG. 7A illustrates one embodiment of a scan generation circuit 306 that comprises a tri-state inverter coupled with another inverter. Additionally, coupled to the scan generation circuit 306 are the scan control signals SCAN_WRITE (308 and 309), SCAN_DATA (401, 402, 403, and 404), and SCAN_READ (311). In FIG. 6, SCAN_WRITE comprises the signals 308, which go to three of the wires of the output signal that include $Z_1$, $Z_2$, and $Z_3$, and the signal 309, which goes to the Z0 wire of the output signal.

The SCAN_DATA signals comprises the signals 401, 402, 403, and 404. The SCAN_READ signal comprises the signal 311.

One or more special stress mode or functionally illegal high activity state generation circuits 310 couple to the wires of the output signal Z. Coupled to the state generation circuits 310 is the special stress mode or functionally illegal high activity state generation control circuit 312. The state generation control circuit 312 receives one or more input control signals and generates a state signal on wire 314 that is received by the state generation circuits 310. One skilled in the art will appreciate that there exists a number of ways to implement a state generation circuit 310. FIG. 7B illustrates one such technique that uses a single N-FET device 311. When the state signal is active high, device 311 will pull down the voltage at node 313. Thus, the present invention can force a value of zero onto the internal evaluate node of an N-NARY logic circuit.

To put the logic circuit back into a normal operating mode, one embodiment of the present invention has the scan generation control circuit 304 receiving an input signal such as a reset signal that generates normal mode activity signals on paths 308 and 309 that are received by the scan generation circuits 306. The reset signal may be combined with the phase 0 clocks CK(P) and CK(E) that allow these clocks to re-synchronize with the other clocks. This allows the phase 0 logic circuits to return to normal operation, precharging and evaluating every clock cycle. The Scan Patent illustrates several other techniques to reset logic circuits to normal operation when the scan/reset modes are combined into a single circuit.

Figure 8A:
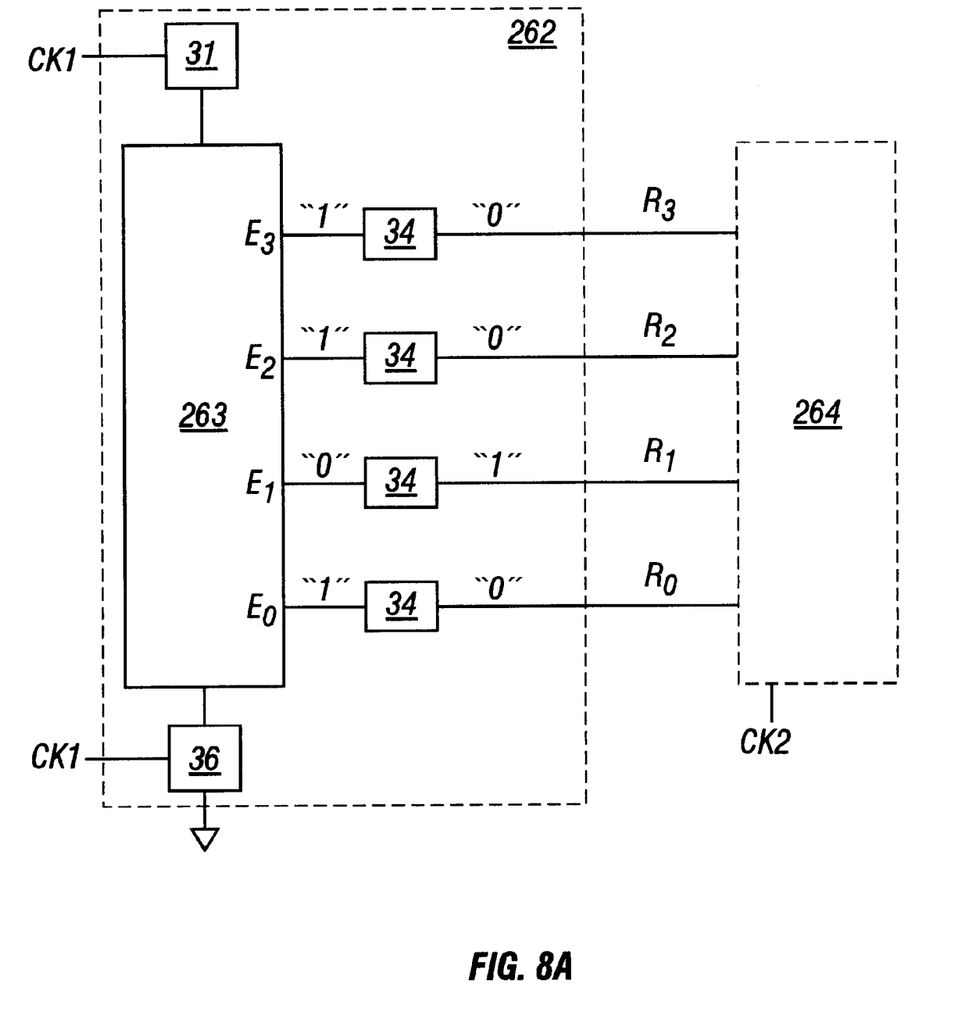
FIG. 8A is an example of information propagating through a series of N-NARY logic.
Figure 8B:
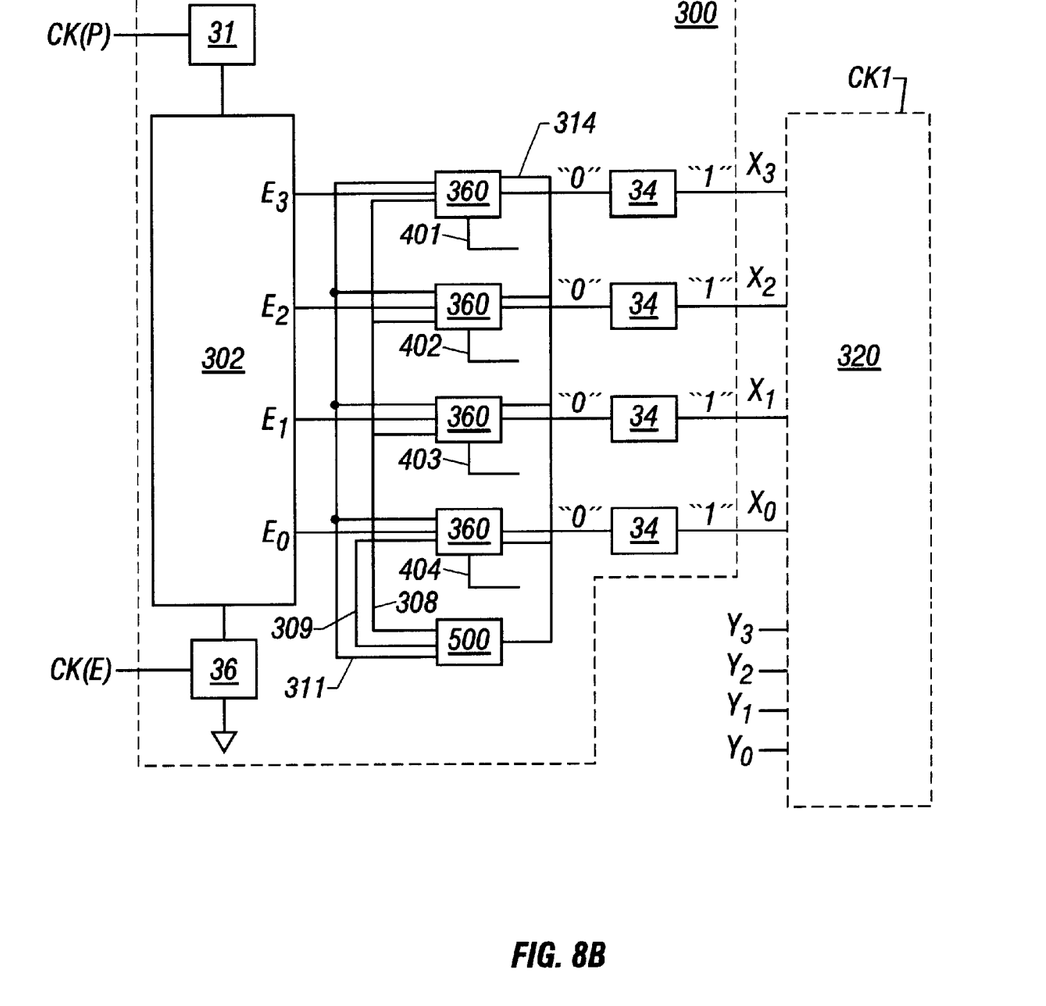
FIG. 8B is an example of the present invention initializing and propagating through N-NARY logic.

FIG. 8A illustrates N-NARY information propagating through a series of N-NARY logic circuits other than a phase 0 logic circuit (or as the case may be, logic circuits using other clock phase signals that may be down stream of the present invention where state generation circuitry is not necessary). The N-NARY logic circuit 262 couples to the phase 1 clock CK1. Internally, circuit 262 comprises the shared logic tree 263 with the internal evaluate nodes $E_0$, $E_1$, $E_2$, and $E_3$; the precharge device 31; the evaluate device 36; and the output buffers 34. The precharge device 31 and the evaluate device 36 both couple to the phase 1 clock CK1. The output signal R of logic circuit 262 comprises the values and wires $R_0$, $R_1$, $R_2$, and $R_3$. As illustrated in FIG. 8A, the values $R_0$, $R_1$, $R_2$, and $R_3$ are an input signal to the next logic circuit 264 in the series, which uses a phase 2 clock CK2.

When operating in a normal mode, a typical N-NARY logic circuit will have some N-NARY value on its internal evaluate nodes. FIG. 8A illustrates the N-NARY value "1101" on the internal evaluate nodes $E_3$, $E_2$, $E_1$, and $E_0$. The N-NARY value on the other side of the output buffers 34 and that comprise the output signal X is "0010" (on $R_3$, $R_2$, $R_1$, and $R_0$ respectively).

FIG. 8B is an example of the present invention initializing and propagating through an N-NARY logic circuit 300. The N-NARY logic circuit 300 couples to the phase 0 clocks CK(E) and CK(P). Internally, circuit 300 comprises the shared logic tree 302 with the internal evaluate nodes $E_0$, $E_1$, $E_2$, and $E_3$; the precharge device 31; the evaluate device 36; and the output buffers 34. The precharge device 31 couples to the phase 0 clock signal CK(P) and the evaluate device 36 couples to the phase 0 clock CK(E). Logic circuit 300 further comprises the state generation circuits 360 (which may also include circuitry for other functions such as scan and reset as described above) and the inverting output buffers 34. A state generation control circuit 500 combines the functions of the separate scan/reset generation control circuit 304 of FIG. 6 with the functions of the state generation control circuit 312 of FIG. 6 to produce the necessary signals to the state generation circuits 360. The signals produced by the state generation control circuit 500 includes scan control signals SCAN_WRITE (308 and 309) and SCAN_READ (311), and the special stress mode state signal (314). And, as described in FIG. 6, circuits 360 couple to the scan data signals SCAN_DATA (401, 402, 403, and 404).

The output signal X of logic circuit 300 comprises the values and wires $X_0$, $X_1$, $X_2$, and $X_3$ As illustrated in FIG. 8B, the values $X_0$, $X_1$, $X_2$, and $X_3$ are an input signal X to the next logic circuit 320 in the series of logic circuits and uses a phase 1 clock CK1. Additionally, logic circuit 320 receives from a different phase 0 logic circuit the input values $Y_0$, $Y_1$, $Y_2$, and $Y_3$ for the input signal Y.

As illustrated in FIG. 8A, when operating in a normal mode, a typical N-NARY logic circuit will have some N-NARY value on its internal evaluate nodes such as the N-NARY value "1101" on the internal evaluate nodes $E_3$, $E_2$, $E_1$, and $E_0$. Upon receipt of a special stress mode or functionally illegal high activity signal from a state generation control circuit, the state generation circuits 360 force the N-NARY values on the internal evaluate nodes $E_3$, $E_2$, $E_1$, and $E_0$ to "0000" as illustrated in FIG. 8B. This in turn forces the output of logic circuit 300 of FIG. 8B (after going through the inverting buffers 34) to "1111" for the output signal X with its values of $X_3$, $X_2$, $X_1$, and $X_0$.

Figure 9:
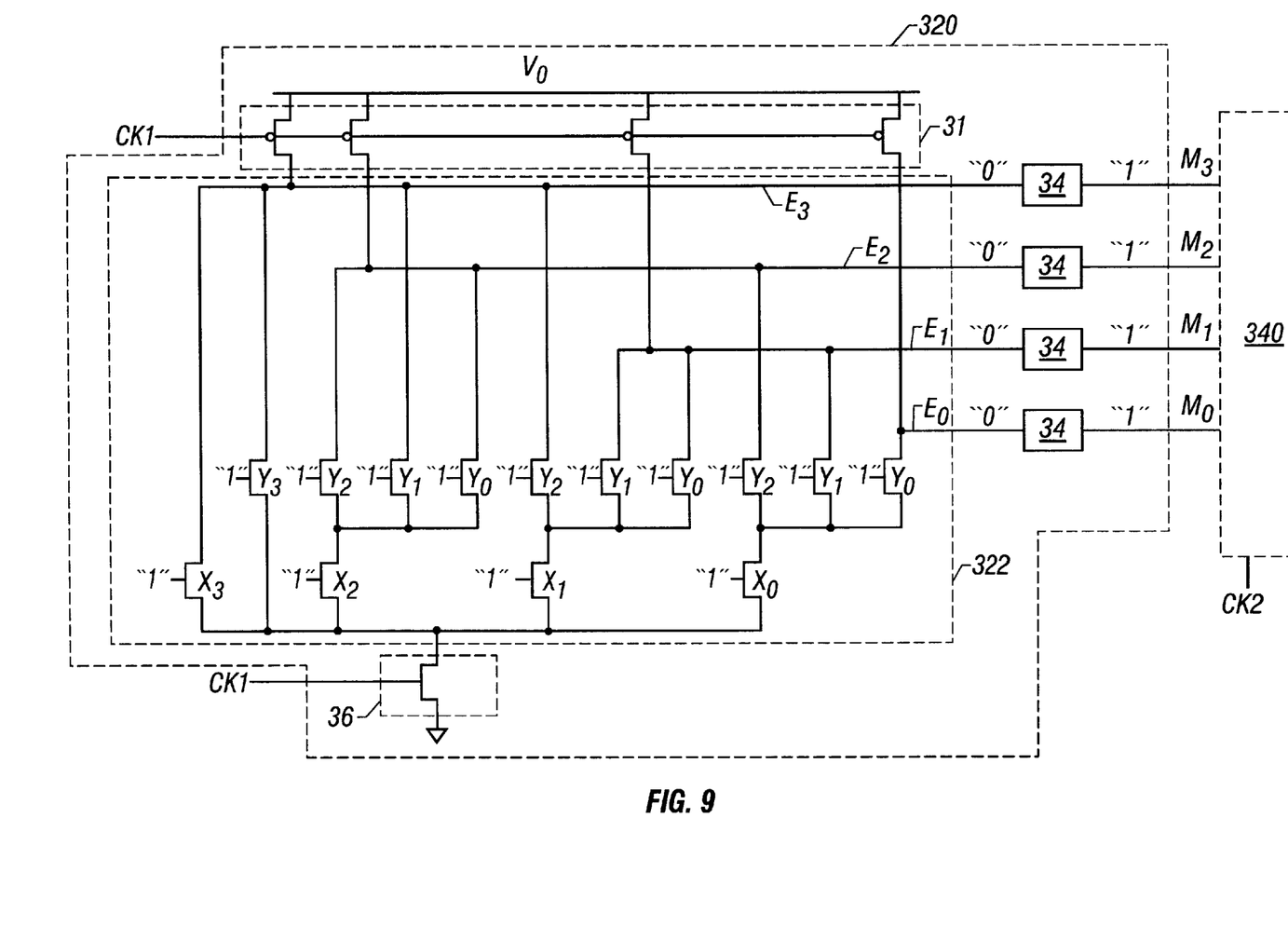
FIG. 9 illustrates the propagation of the present invention through the internal evaluate nodes of N-NARY logic.

FIG. 9 illustrates the propagation or the self-perpetuating feature of the present invention through the internal evaluate nodes of N-NARY logic. FIG. 9 illustrates the N-NARY logic circuit 320 with the phase 1 clock CK1 from FIG. 8B. As shown, logic circuit 320 couples to the next logic circuit 340 that has the phase 2 clock CK2. Internally, logic circuit 320 comprises the shared logic tree 322 with the internal evaluate nodes $E_0$, $E_1$, $E_2$, and $E_3$; the precharge devices 31; the evaluate device 36; and the inverting output buffers 34. The precharge devices 31 and the evaluate device 36 both couple to the phase 1 clock signal CK1. If logic circuit 320 is performing the OR/NOR function as illustrated in FIG. 3, then the internal transistors will be as shown with the appropriate devices to receive the input signals X and Y that comprises the values and wires $X_0$, $X_1$, $X_2$, and $X_3$ and the values and wires $Y_0$, $Y_1$, $Y_2$, and $Y_3$. The output signal M of logic circuit 320 comprises the values and wires $M_0$, $M_1$, $M_2$, and $M_3$. As illustrated in FIG. 8B, the values $M_0$, $M_1$, $M_2$, and $M_3$ are an input signal M to the next logic circuit 340 in the series of logic circuits and uses a phase 2 clock, CK2.

As illustrated in FIG. 9, the input signal X comprises the functionally illegal high activity state values of "1111" and the input signal Y comprises the functionally illegal high activity state values of "1111". With the input values of logic circuit 320 both being in the functionally illegal high activity state, the internal evaluate nodes $E_0$, $E_1$, $E_2$, and $E_3$ are forced to the value "0000". This in turn forces the output of logic circuit 320 (after going through the inverting buffers 34) to "1111" for the output signal M with its values of $M_3$, $M_2$, $M_1$, and $M_0$. One can see that as long as all inputs to an N-NARY gate are in an all-ones state then the outputs of that gate will also evaluate to the all-ones state.

The present invention is useful for any integrated circuit that comprises N-NARY logic. Therefore, the present invention provides for circuitry to support the functionally illegal high activity rig state at the N-NARY logic boundary (between N-NARY and binary logic for example) and at cache array boundaries (if present). If an integrated circuit contains SRAM arrays such as needed to build cache units, the present invention provides that the SRAM arrays would be exercised via Built-In Self-Test (BIST) during burn-in or stress testing. The circuitry at the N-NARY boundary to provide this function to occur is simple masking logic that prevents the illegal state (all-ones from the N-NARY devices) from disturbing the SRAM BIST. Additionally, inputs to N-NARY logic either from SRAM arrays or from other sources outside the N-NARY logic domain are forced to be all ones so that the functionally illegal high activity state is present throughout the N-NARY logic domain.

To summarize, the present invention comprises a method and apparatus for N-NARY logic and dynamic logic that initializes the logic to a special stress mode. The present invention comprises a logic circuit that includes a shared logic tree with one or more evaluate nodes, one or more precharge devices, and an evaluate device. Coupled to the evaluate nodes is a state generation control circuit that generates a state signal. A state generation circuit receives the state signal from the state generation control circuit and initializes the evaluate nodes to a functionally illegal state that initializes the logic circuit to a special stress mode. One embodiment of the present invention initializes the evaluate nodes to a low state. Additionally, the state generation circuit can further comprise additional functions such as scan and reset. And, the present invention can comprise N-NARY logic and or dynamic logic. When the first logic circuit in a series of logic circuits is initialized to the functionally illegal state, the present invention will initialize the succeeding logic circuits in the series as each phase in the different clock domains evaluate, which initializes the succeeding logic circuits to the special stress mode.

Other embodiments of the invention will be apparent to those skilled in the art after considering this specification or practicing the disclosed invention. The specification and examples above are exemplary only, with the true scope of the invention being indicated by the following claims.

We claim the following invention:

1. An apparatus that initializes a logic circuit to a special stress mode, comprising:
    a shared logic tree with one or more evaluate nodes, one or more precharge devices, and an evaluate device;
    a state generation control circuit that generates a state signal; and
    a state generation circuit that couples to said state generation control circuit and said evaluate nodes, said state generation circuit receives said state signal from said state generation control circuit and initializes said evaluate nodes to a functionally illegal state that initializes the logic circuit to the special stress mode.

2. The apparatus of claim 1 wherein said shared logic tree, said precharge devices, and said evaluate device comprise N-NARY logic.

3. The apparatus of claim 2 wherein said functionally illegal state comprises initializing said evaluate nodes to a low state.

4. The apparatus of claim 1 wherein said state generation circuit further comprises additional functions that include scan and reset.

5. The apparatus of claim 1 that further comprises a series of logic circuits wherein said functionally illegal state propagates through said series of logic circuits and initializes said series of logic circuits to the special stress mode.

6. A system that initializes a logic circuit to a special stress mode, comprising:
    a shared logic tree with one or more evaluate nodes, one or more precharge devices, and an evaluate device;
    a state generation control circuit that generates a state signal; and
    a state generation circuit that couples to said state generation control circuit and said evaluate nodes, said state generation circuit receives said state signal from said state generation control circuit and initializes said evaluate nodes to a functionally illegal state that initializes the logic circuit to the special stress mode.

7. The system of claim 6 wherein said shared logic tree, said precharge devices, and said evaluate device comprise N-NARY logic.

8. The system of claim 7 wherein said functionally illegal state comprises initializing said evaluate nodes to a low state.

9. The system of claim 6 wherein said state generation circuit further comprises additional functions that include scan and reset.

10. The system of claim 6 that further comprises a series of logic circuits wherein said functionally illegal state propagates through said series of logic circuits and initializes said series of logic circuits to the special stress mode.

11. A method to make an apparatus that initializes a logic circuit to a special stress mode, comprising:
    providing a shared logic tree with one or more evaluate nodes, one or more precharge devices, and an evaluate device;
    providing a state generation control circuit that generates a state signal; and
    coupling a state generation circuit to said state generation control circuit and said evaluate nodes, said state generation circuit receives said state signal from said state generation control circuit and initializes said evaluate nodes to a functionally illegal state that initializes the logic circuit to the special stress mode.

12. The method of claim 11 wherein said shared logic tree, said precharge devices, and said evaluate device comprise N-NARY logic.

13. The method of claim 12 wherein said functionally illegal state comprises initializing said evaluate nodes to a low state.

14. The method of claim 11 wherein said state generation circuit further comprises additional functions that include scan and reset.

15. The method of claim 11 that further comprises a series of logic circuits wherein said functionally illegal state propagates through said series of logic circuits and initializes said series of logic circuits to the special stress mode.

16. A method that initializes a logic circuit to a special stress mode, comprising:
    generating a state signal with a state generation control circuit;
    receiving said state signal from said state generation control circuit into a state generation circuit that couples to said state generation control circuit and a shared logic tree with one or more evaluate nodes, one or more precharge devices, and an evaluate device; and
    initializing said evaluate nodes to a functionally illegal state that initializes the logic circuit to the special stress mode.

17. The method of claim 16 wherein said shared logic tree, said precharge devices, and said evaluate device comprise N-NARY logic.

18. The method of claim 17 wherein said functionally illegal state comprises initializing said evaluate nodes to a low state.

19. The method of claim 16 wherein said state generation circuit further comprises additional functions that include scan and reset.

20. The method of claim 16 that further comprises a series of logic circuits wherein said functionally illegal state propagates through said series of logic circuits and initializes said series of logic circuits to the special stress mode.

* * * * *